(12) United States Patent
Marti-Canales et al.

(10) Patent No.: US 6,469,672 B1
(45) Date of Patent: Oct. 22, 2002

(54) METHOD AND SYSTEM FOR TIME DOMAIN ANTENNA HOLOGRAPHY

(75) Inventors: Javier Marti-Canales, Leiden; Leonardus Petrus Ligthart, Zoetemeer, both of (NL)

(73) Assignee: Agence Spatiale Europeenne (an inter-governmental organization), Paris Cedex (FR)

( * ) Notice: Subject to any disclaimer, the term of this patent is extended or adjusted under 35 U.S.C. 154(b) by 0 days.

(21) Appl. No.: 09/809,643

(22) Filed: Mar. 15, 2001

(51) Int. Cl.[7] .................................................. H01Q 3/00

(52) U.S. Cl. ...................... 343/703; 342/360

(58) Field of Search ..................... 343/703, 781 CA; 342/360, 361; 324/637, 638; H01Q 3/00

(56) References Cited

U.S. PATENT DOCUMENTS

| | | | | |
|---|---|---|---|---|
| 4,034,370 A | * | 7/1977 | Mims | 343/703 |
| 4,075,555 A | * | 2/1978 | Wight et al. | 324/58.5 R |
| 4,201,987 A | * | 5/1980 | Tricoles et al. | 343/703 |
| 5,119,105 A | * | 6/1992 | Ngai et al. | 343/703 |
| 5,374,934 A | * | 12/1994 | Miura et al. | 342/360 |
| 6,288,683 B1 | * | 9/2001 | Deguchi et al. | 343/703 |

* cited by examiner

*Primary Examiner*—Tho Phan
(74) *Attorney, Agent, or Firm*—Barry R. Lipsitz

(57) ABSTRACT

A fast, novel method is disclosed which permits to determine the electrical features of an antenna. The antenna is excited with an ultra-short voltage pulse and the far field radiation pattern of the antenna is measured. The resulting time-varying field distribution across the antenna aperture is then reconstructed using time domain holography. A direct analysis of the holographic plot permits the determination a wide range of electrical properties of the antenna.

6 Claims, 4 Drawing Sheets

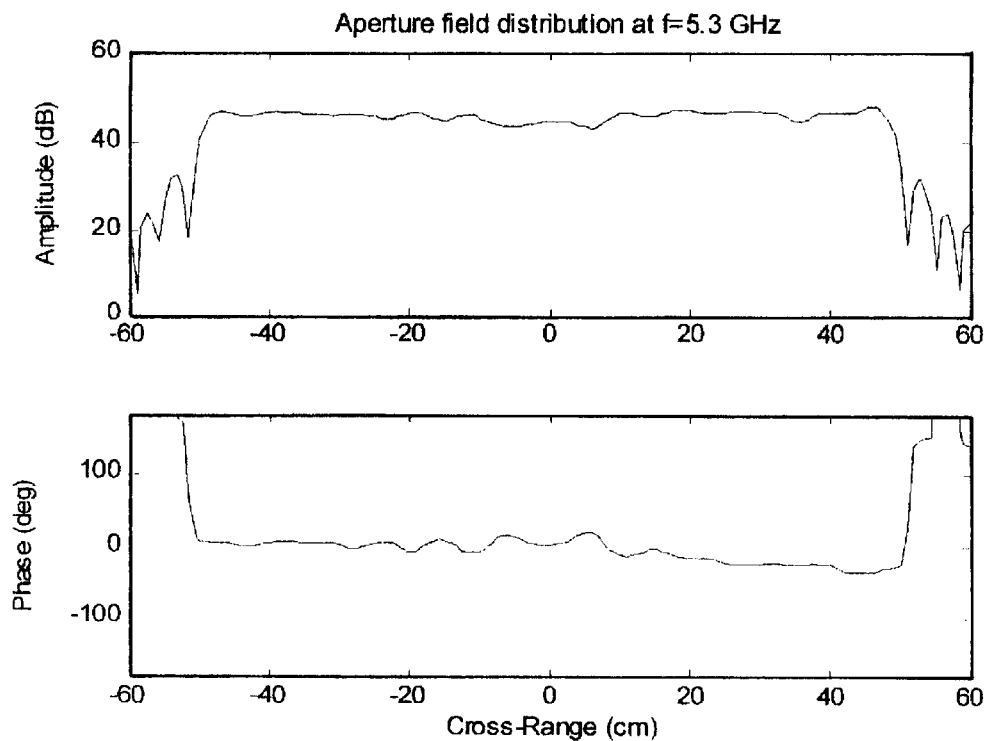
FIG. 3
FIG. 4
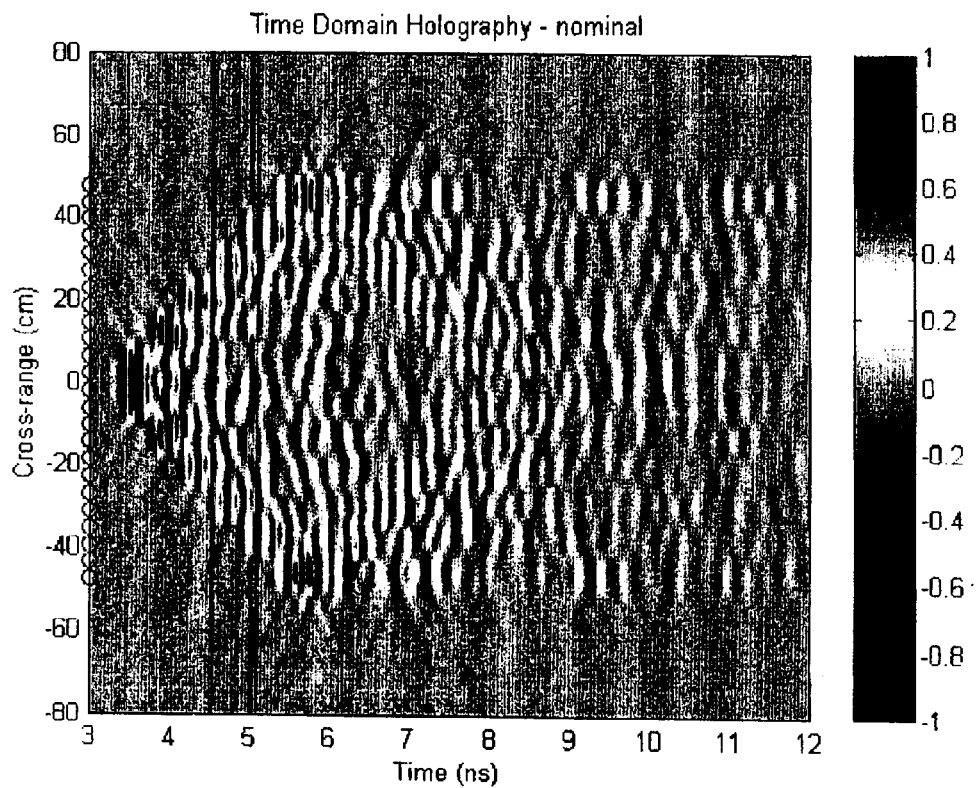

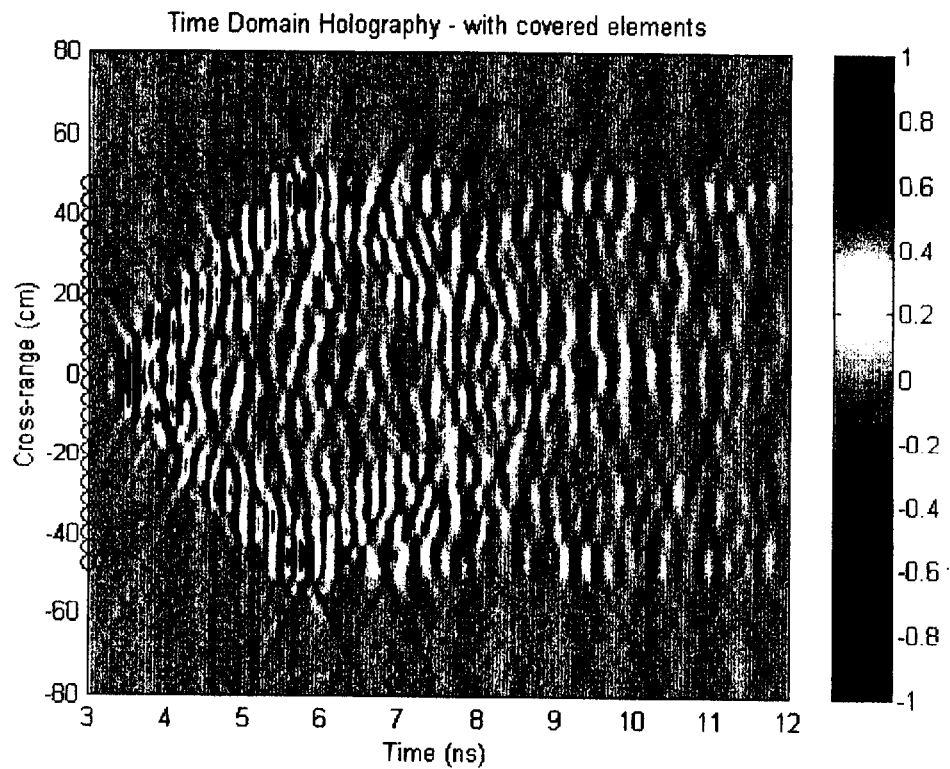
FIG. 5
FIG. 6
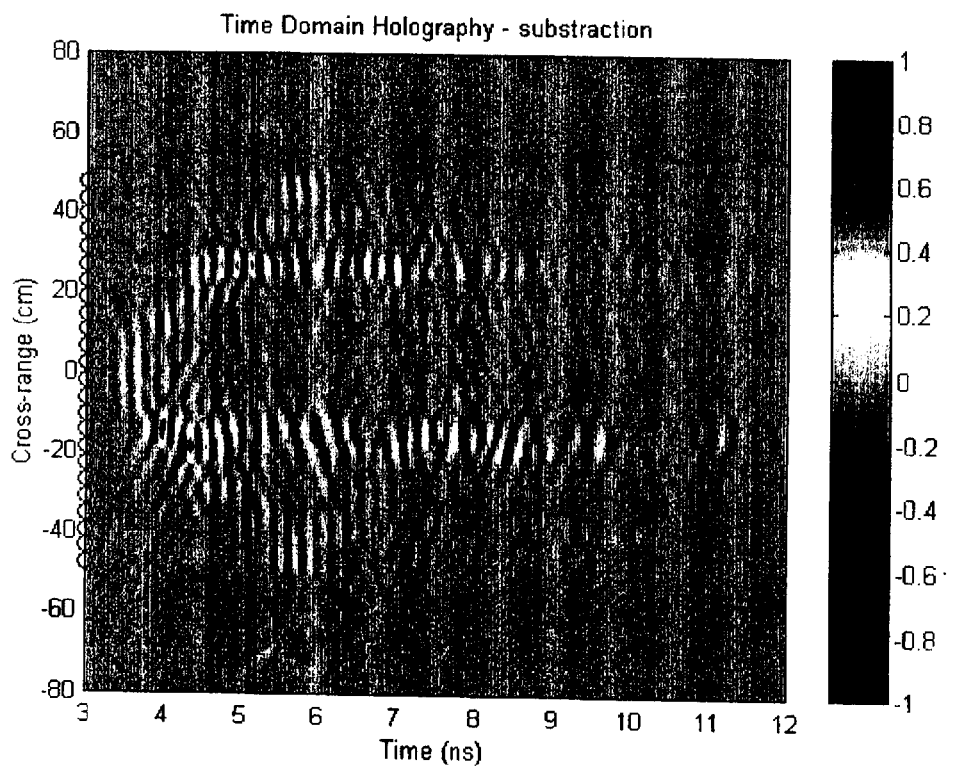

METHOD AND SYSTEM FOR TIME DOMAIN ANTENNA HOLOGRAPHY

BACKGROUND OF THE INVENTION

The present invention relates broadly to antenna diagnostics and more particularly to a new holographic method for use in antenna diagnostics.

Holographic methods for antenna diagnostics are extensively used to verify the excitation or the detection of failure of individual elements in antenna arrays and to determine the surface accuracy of antenna reflectors used in radiotelescopes.

Typically, these applications of holography are solely performed at the frequency of operation. The field measurements are performed at the central frequency of the operating bandwidth and eventually also at the edges of the frequency band. Holography in the frequency domain is equivalent to restricting attention to the electrical properties of antennas at a single frequency and consequently the extent of information provided by the frequency domain holography is limited. The complete behaviour of the antenna is fully described only when the entire frequency response is taken into account. This considerably increases the testing time.

Further, the use of large satellite constellations is a common trend in current telecommunication and navigation projects, e.g. Skybridge and GalileoSat. The large number of antennas required immediately calls for faster testing methods, but not at the expense of accuracy: a reasonable trade-off should always be commercially accepted.

Another issue that increases testing time is the frequency bandwidth over which the antennas have to be operating. This is the case for antennas for ultra-wide band radars, which typically have bandwidths in excess of 20%. In addition, the potential radiation interference of antennas with neighbouring instruments on board a spacecraft requires also measurements out of the operational bandwidth, which implies larger test campaigns, e.g. antennas on board Envisat. Generally, the testing of such antennas requires reconfiguration of the measurement range several times to cover the desired bandwidth. Consequently, the measurement time and cost increase. The testing time for traditional measurements may be too large and, consequently too expensive, from an industrial point of view. Therefore, there is a need for faster and less expensive antenna measurement capabilities.

Time domain measurements have the advantage of determining the wideband frequency response of an antenna under test. Therefore, they are very fast, not only because of the shorter measurement time required, but also because the radiation pattern over a large number of frequencies can be directly retrieved from the same measurement. To achieve the same performance with conventional frequency domain instrumentation would require about ten times the measurement time needed in the time domain, if high averaging is applied and the same number of frequencies is measured.

The unique features of time domain measurements are exploited in accordance with this invention in the time domain antenna holography. The information obtained from this new holographic approach offers therefore much wider insight into the antenna electrical characteristics than a measurement at a single frequency. In fact, this involves the reconstruction of the time-varying far field distribution across an aperture from direct time domain measurements.

BRIEF SUMMARY OF THE INVENTION

It is an object of this invention to provide a novel, fast method and system which permits use of time domain holography for antenna diagnostics.

Another object of the invention is to provide a novel method which permits the reconstruction of time-varying far field distribution across the antenna aperture from direct time domain measurements.

In accordance with this invention, the antenna under test is placed and aligned in an antenna test range and the antenna or the range antenna is excited with an ultra-short duration voltage pulse and the antenna voltage radiation pattern in the time domain is measured using a digitising oscilloscope connected to the antenna under test or the range antenna. The measured radiation pattern, if necessary, is converted to far field. The resulting time-varying far field distribution across the antenna aperture is then reconstructed using time domain holography. Electrical properties of the antenna are directly retrieved from direct analysis of the holographic plot.

A wide range of electrical properties of an antenna, such as element failure diagnostics in array antennas and details of the feed network design, can be directly retrieved from direct analysis of the time-varying far field distribution.

The approach of the invention thus provides unique possibilities for analysis propagation effects, reverse engineering of array feed networks and substrate electrical properties.

BRIEF DESCRIPTION OF THE DRAWINGS

FIG. 3 shows the reconstructed far field against time and along a subarray of the Envisat Advanced Synthetic Aperture Radar (ASAR) antenna with a standard frequency domain measurements FIG. 4 shows the time domain holographic far field reconstruction in accordance with the invention for the exemplary panel of the Envisat ASAR antenna.

FIG. 5 shows the time domain holographic far field reconstruction for the Envisat ASAR antenna panel with simulated failure of three elements of the subarray.

FIG. 6 shows the field distribution subtraction to highlight the locations of the simulated failures.

DESCRIPTION OF AN EMBODIMENT OF THE INVENTION

Figure 1:
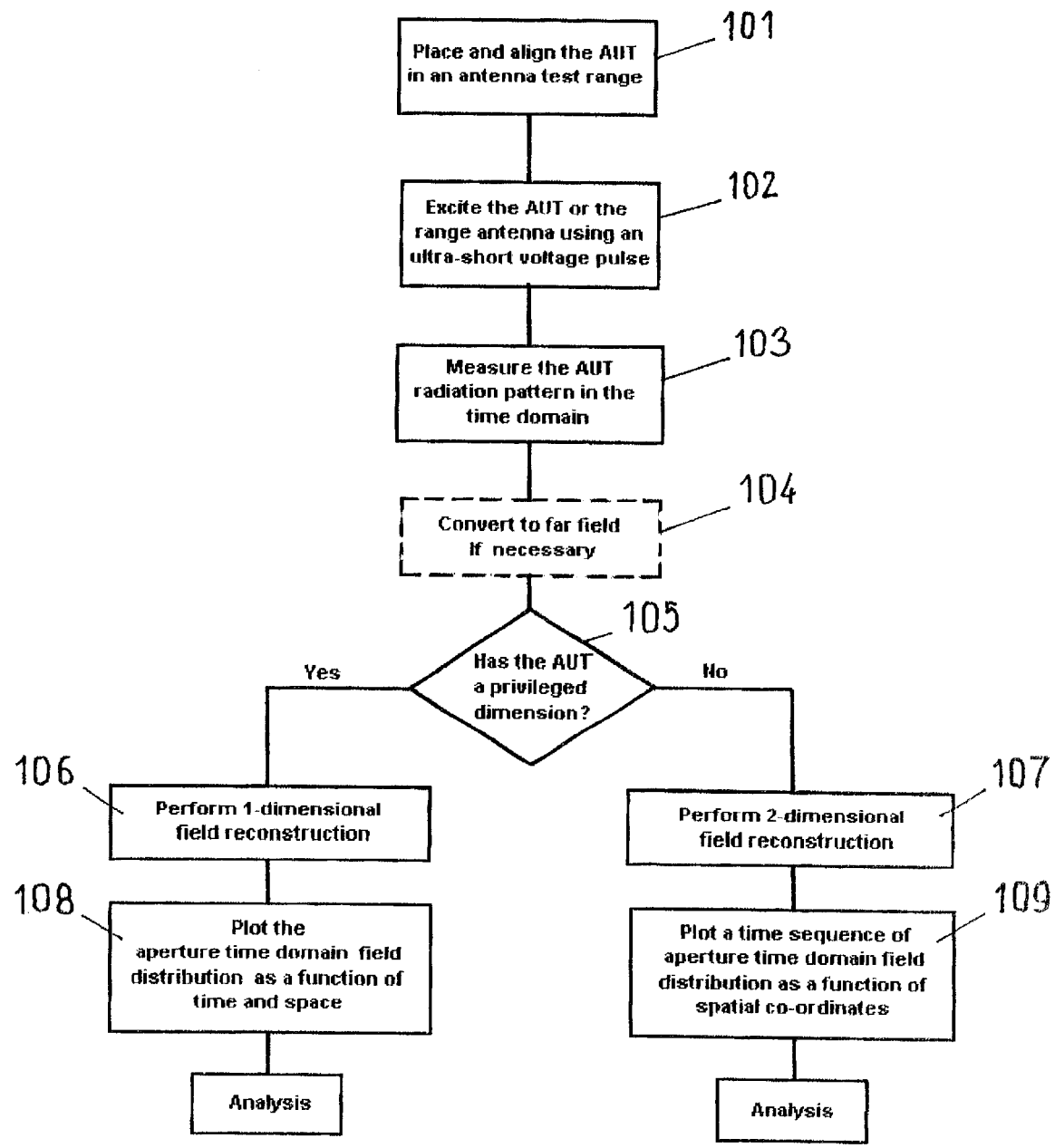
FIG. 1 is a flow chart of the time domain holographic method of the invention.

The present invention is based on time domain radiation pattern measurements. The method used in accordance with the invention is described herein with reference to the flow chart shown in FIG. 1. To perform time domain measurements, the antenna under test is placed and aligned in an antenna test range (Box 101) and excited using an ultra-short voltage pulse having a finite amplitude (Box 102). The radiation pattern of the antenna under test is measured in the time domain and recorded using a digital oscilloscope connected to the range antenna or to the antenna under test (Box 103). The pulse has an associated broadband spectrum in the frequency domain. Therefore, the time domain excitation is equivalent to exciting the antenna in the frequency domain with all frequency components at once. In this way, only one impulse allows the characterization of the antenna over the entire frequency spectrum.

In accordance with the invention, the time-varying far field distribution across the antenna aperture is reconstructed from direct radiation pattern measurements in the time domain using a software process as set forth herein after.

The relationship between the time domain far field and the wave spectrum is given by:

$$F(\theta, \Phi; t) = \frac{\cos\theta}{c} \frac{\partial A(\xi, \eta; t)}{\partial t} \quad (1)$$

where $F(\theta, \phi; t)$ is the time domain far field in spherical coordinates, $A(\xi, \eta; t)$ is the time domain wave spectrum, and c is the speed of light. The wave spectrum coordinates are derived by dividing the director cosines ($k_x$, $k_y$) by the wave number k as follows:

$$\xi = k_x/k = c^{-1} \sin\theta \cos\phi$$

$$\eta = k_y/k = c^{-1} \sin\theta \sin\phi$$

In the frequency domain, the relation between the visible plane wave spectrum and the near field distribution in Cartesian coordinates is provided by:

$$E(x, y, z; \omega) = \frac{1}{2\pi} \iint_{k_x^2+k_y^2<k^{-2}} A(k_x, k_y; \omega) e^{j(k_x x+k_y y+k_z z)} dk_x dk_y \quad (2)$$

or alternatively, $$E(x, y, z; \omega) = \frac{1}{2\pi} \iint_{\xi^2+\eta^2<c^{-2}} \omega^2 A(\xi, \eta; \omega) e^{j\omega(\xi x+\eta y+\zeta z)} d\eta d\xi \quad (3)$$

where $\zeta = k_z/k = c^{-1} \cos\theta$. Then, applying a Fourier transform to both sides of the previous equation, we obtain:

$$E(x, y, z; \omega) = \frac{1}{2\pi} \iint_{\xi^2+\eta^2<c^{-2}} \frac{\partial^2}{\partial t^2} A(\xi, \eta; t - \xi x - \eta y - \zeta z) d\xi d\eta \quad (4)$$

Equation (4) relates the measured far field to the near field distribution over an arbitrary surface.

In some cases, and for diagnostic purposes, interest is focussed on only one dimension, e.g. linear arrays. Then, it is more convenient to retrieve the aperture field distribution from a single cut in the far field (e.g. $\phi=0$) than to extract it from the full aperture reconstruction. Therefore, one-dimensional holography is preferred.

To derive the one-dimensional formulation, it is assumed that there is no field variation along the y-axis, i.e. the field is assumed to be uniform. Therefore, at z=0, the equation for the time varying aperture field is simplified to:

$$E(x; t) = -\frac{1}{\pi c} \int_{-c^{-1}}^{c^{-1}} \frac{\partial^2}{\partial t^2} A(\xi; t - \xi x) d\xi \quad (5)$$

Finally, by introducing the one-dimensional case of (1) into equation (5), the expression of the one-dimensional time domain holography is provided by:

$$E(x; t) = -\frac{1}{\pi c} \int_{-\pi/2}^{\pi/2} \frac{\partial}{\partial t} F(\theta; t - c^{-1} \sin\theta x) d\theta \quad (6)$$

Thus, equations (4) and (6) relate the measured far field to the aperture fields, both in the time domain. When the radiation pattern is measured in a near field range, the field measurements are converted to far field measurements (Box 104) in accordance with the scanning mode of the test range, namely planar, cylindrical, spherical or bi-polar. The transformation relationship for the different modes are disclosed in the literature (e.g. T. B. Hansen, A. D. Yaghjian: Planar near-field scanning in the time domain, IEEE Trans. On Antennas and Propagation, Vol. 42, No. 9, Sep. 1994, pp. 1280–1300 O. M. Bucci, G. d'Elia, M. D. Migliore: Near-field far-field tranformation in lime domain from optimal plane-polar samples, IEEE Trans. On Antennas and Propagation, Vol. 46, No. 7, July 1998, pp. 1084–1088 ; A. Shlivinski, E. Heyman : Time-domain near-field analysis of short pulse antennas—Part 1: Spherical wave (multipole) expansion, IEEE Trans. on Antennas and Propagation, Vol. 47, No. 2, February 1999, pp. 271–279).

Depending on whether the antenna under test has a privileged dimension or not (Box 105), a one-dimensional or a two-dimensional reconstruction process is performed, i.e. the algorithm used for the reconstruction of the aperture fields is based on equation (6) or (4) above, respectively.

More specifically, if the antenna under test is a linear array, i.e. it has a privileged dimension, only a single cut of the far field radiation pattern can be used for the reconstruction. In such a case, the one-dimensional reconstruction algorithm is applied as follows (Box 106):

(a) Calculate the derivative of the measured far field cut with respect to time;

(b) Calculate the integral of the derivative over the range extending from $-\pi/2$ to $\pi/2$;

(c) Divide the result by $\pi$ times the speed of light c.

When the antenna under test has not a privileged dimension, the two-dimensional reconstruction algorithm (Box 107) is applied, which comprises the following steps:

(d) Calculate the wave spectrum A associated to the measured radiation pattern: in case of near field measurements, convert the measured pattern to far field measurements;

(e) Calculate the second derivative of the wave spectrum A with respect to time;

(f) Calculate the double integral of the derived wave spectrum over the propagating space;

(g) Divide the result by 2*pi.

The reconstructed aperture field distribution is recorded and plotted as a function of time and space (Box 108) or the time sequence of the reconstructed aperture field distribution is plotted as a function of spatial co-ordinates (Box 109). The holographic plot is used directly for diagnostic analysis in order to determine a wide range of electrical properties of the antenna under test.

The analysis of the plot strongly depends on the type of antenna under test. In the case of an array antenna, for instance, the following features are normally observed:

Non-destructive reverse engineering: geometrical details of the feed distribution network are obtained from the form in which the radiated field appears in the plot with respect to the array geometry.

Non-destructive reverse engineering: from the ratio at which the field is radiated from the elements, the velocity in the feed distribution network can be calculated and further related to the effective dielectric constant of the substrate, if applicable.

Faulty elements: location of vanished or hardly no radiated field from one of the elements of the array.

Figure 2:
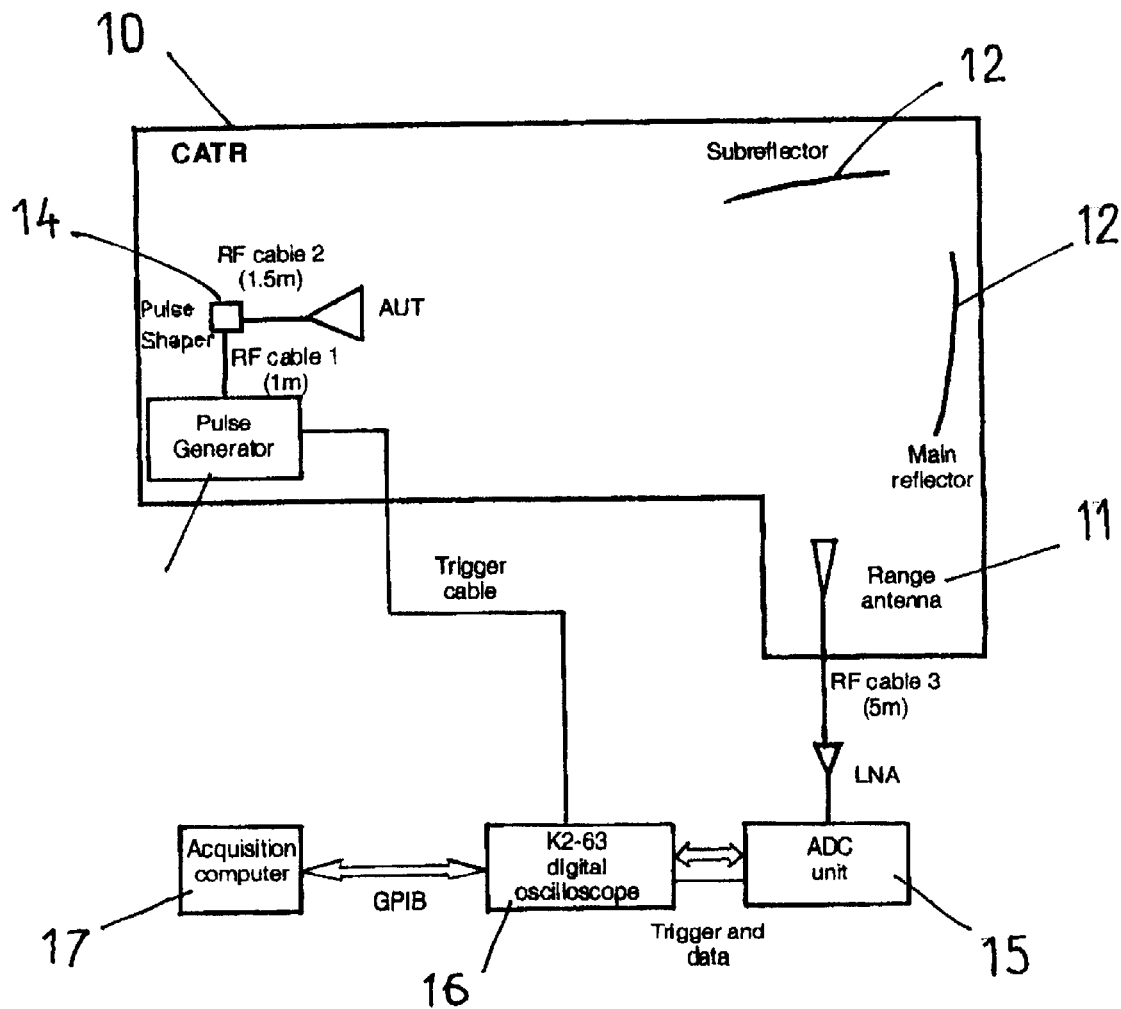
FIG. 2 is a schematic representation of an exemplary test range used for verifying the method of the invention.

The method of this invention has been applied experimentally to one panel of the known Envisat ASAR antenna. The panel (1×0.6 m) was formed by 16 linear subarrays of 24 dual linearly polarized elements spaced every 0.74 ξ. The far field radiation pattern of the central subarray was firstly measured at the central frequency (5.3 GHz) and immediately after in the time domain to allow comparison of the holographic results. Both measurements were performed in an antenna test range apparatus as schematically represented in FIG. 2.

The antenna test range used consists of a small chamber 10 including a range antenna 11 and a double reflector configuration 12 serving to collimate the spherical wave transmitted by the range antenna, thereby creating a region of quasi-planar amplitude and phase front known as the quiet zone. The antenna under test is denoted AUT. The far field radiation pattern of the antenna under test, located in the quiet zone, is measured directly without the need for a transformation.

The measurement instrumentation includes four parts: a pulse generator 13, a pulse shaper 14, an analog-to-digital converter unit 15 and a digital oscilloscope 16, which are controlled from a computer 17. The length of cabling was dimensioned such that possible reflections are separated by a minimum of 15 ns in time. The pulse generator 13 and the pulse shaper 14 were accommodated on the main positioner slide table to minimize the cable length. The analog-to-digital converter 15 and the digital oscilloscope 16 were set outside the chamber to ease operations.

The pulse from the pulse generator 13 is for instance a -9V step pulse having a pulse repetition frequency of 100 kHz. This pulse is then derived by the pulse shaper 14 which provides the short duration test pulse. With such a pulse, measurements up to 18 GHz can be performed with sufficient dynamic range. Current technology offers pulses of 30 ps duration and 30 V amplitude. This reduction in time enlarges the usable frequency spectrum to 26 GHz.

In transmission measurements, the antenna under test is fed with the test pulse, while the range antenna is connected to the analog-to-digital converter and then to the digital oscilloscope. Synchronization of the measurement set-up is achieved at the receiving end through a dedicated trigger signal which is generated by the pulse generator. In receiving measurements, the range antenna is fed with the test pulse and the antenna under test is connected to the receiving chain. Since reflections occur at connectors and at the pulse shaper, the RF cabling is properly dimensioned to separate in time the multiple internal reflections, thus allowing clean measurements. In those cases where the dynamic range of the above set-up is not sufficient, it is possible to include in the receiving chain a low-noise broadband amplifier or several amplifiers in cascade. It has been observed that the amplifier introduces no distortion into the measurements, but only a desired overall increase in the dynamic range.

Using the above instrumentation. antenna radiation pattern characteristics can be retrieved over a broad bandwidth, i.e. from a few MHz to 18 GHz. In this way, the radiation pattern at any given frequency within the 18 GHz bandwidth can be retrieved from the time domain measurements. Experimental tests have shown that, if sufficient dynamic range is available, the retrieved radiation patterns are in excellent agreement with those measured using conventional frequency domain instrumentation.

From the frequency domain measurements, the amplitude and phase distribution shown in FIG. 3 was obtained using standard holographic methods. From these plots, the variations in excitation along the array can be appreciated. It can also be seen that there are no faulty elements in the array.

Time domain holography was then applied to the measured time domain far field using the algorithm based on equation (6). The reconstructed field against time and along the subarray is shown in FIG. 4. In this plot, the slot size of the linear subarray and their position are superimposed along the Y-axis to facilitate the analysis. The plot reveals many more electrical features of the antenna than can be seen in the frequency domain holography. The possibility of retrieving details of the design and fabrication of the feed network, and visualisation of out of band reflections at the edge of the array are among the most innovative diagnostic capabilities of time domain holography.

The first noticeable feature in the plot of FIG. 4 is the design of the feed network. The time variation reveals that the elements are fed in pairs from the center of the subarray. Furthermore, the speed of propagation inside the feed network can be obtained by relating the positions of the radiating pairs to the time the pairs begin to radiate. Thus, the retrieved propagation speed inside the feed network is $2.8 \times 10^8$ m/s, very close to the velocity of propagation in free space. Moreover, from this velocity the effective dielectric constant of the material used in the feed network can be calculated, namely 1.16. These results were in full agreement with the original design data. Another feature revealed in the plot is that, due to the wideband nature of the holographic reconstruction, reflected waves are identified at the edge of the subarray. In fact, the antenna is only adapted to provide a full match within the operational bandwidth and therefore outside this bandwidth reflections due to mismatch are likely to happen.

In order to explore the diagnostic capabilities of the time domain holography according to this invention, additional measurements of the subarray were carried out with three elements covered to simulate failing elements. The positions of these simulated failing elements were #6, #16 and #17, counting from the left to the right.

The result of applying time domain holography to the measured pattern is shown in FIG. 5. The plot resembles the one in FIG. 4, but at those locations and instants where the failing elements are located, i.e. where the field vanishes. With the information contained in this plot, the failing elements can be identified.

Finally, the two field distributions (FIG. 4 and FIG. 5) are subtracted and the result is presented in FIG. 6. The subtraction highlights the locations of the simulated failures, thus providing a direct comparison between two states of the same antenna, e.g. nominal functioning and failure.

The comparison of antenna states is very attractive for qualification testing, where the antenna is subjected to a number of different tests and its electrical performance should remain the same before and after every test. At present, due to the slowness of antenna testing in the frequency domain, antenna performance is merely evaluated by measuring the voltage standing wave ratio (VSWR) at the antenna terminals before and after mechanical or environmental tests. In view of the shorter time needed for time domain measurements and the insight provided, time domain holography is recommended in order to increase the accountability of testing results.

What is claimed is:

1. A method for determining electrical features of an antenna, comprising the steps of:

(a) placing and aligning the antenna under test in an antenna test range, (b) exciting the antenna under test with an ultra-short voltage pulse, (c) measuring a voltage radiation pattern of the antenna under test in the time domain using a digitizing oscilloscope, (d) reconstructing time-varying field distribution across an aperture of the antenna as a function of time and space in a holographic plot, (e) determining electrical characteristics of the antenna directly from the holographic plot.

2. The method of claim 1, wherein the radiation pattern measurements are converted to far field measurements prior to be used in the step of reconstructing the time-varying field distribution.

3. The method of claim 1, wherein the step of reconstructing the time-varying field distribution comprises the steps of:

(a) calculate a derivative of a measured far field cut with respect to time;

(b) calculate the integral of the derivative over a range extending from $\pi/2$ to $\pi/2$;

(c) divide the result by $\pi$ times the speed of light c.

4. The method of claim 1, wherein the step of reconstructing the time-varying field distribution comprises the steps of:

(a) calculate a wave spectrum associated to the measured radiation pattern;

(b) calculate a second derivative of the wave spectrum with respect to time;

(c) calculate a double integral of the derived wave spectrum over the propagating space;

(d) divide the result by 2*pi.

5. A method of reconstructing the aperture field distribution of an antenna in the time domain from direct radiation pattern measurements, comprising the steps of:

(a) Measuring the voltage radiation pattern of the antenna in the time domain, (b) Calculate the derivative of the measured far field cut with respect to time;

(c) Calculate the integral of the derivative over the range extending from $\pi/2$ to $\pi/2$;

(d) Divide the result by $\pi$ times the speed of light c;

(e) Recording the final result thus obtained.

6. A method of reconstructing the aperture field distribution of an antenna in the time domain from direct radiation pattern measurements, comprising the steps of:

(a) Measuring the voltage radiation pattern of the antenna in the time domain;

(b) Calculate the wave spectrum associated to the measured radiation pattern;

(c) Calculate the second derivative of the wave spectrum with respect to time;

(d) Calculate the double integral of the derived wave spectrum over the propagating space;

(e) Divide the result by 2*pi.

* * * * *